United States Patent
Nguyen et al.

[11] Patent Number: 6,114,251
[45] Date of Patent: Sep. 5, 2000

[54] METHOD OF FABRICATION FOR ULTRA THIN NITRIDE LINER IN SILICON TRENCH ISOLATION

[75] Inventors: Thien T. Nguyen, Austin; Mark I. Gardner, Cedar Creek; Frederick N. Hause, Austin, all of Tex.

[73] Assignee: Advanced Micro Devices, Inc., Sunnyvale, Calif.

[21] Appl. No.: 09/226,024

[22] Filed: Jan. 6, 1999

[51] Int. Cl.[7] .................................................. H01L 21/3065
[52] U.S. Cl. ..................... 438/710; 438/711; 438/712; 438/713; 438/723; 438/724
[58] Field of Search ..................... 438/706, 723, 438/724, 711, 713, 697, 712, 701, 743, 744, 710

[56] References Cited

U.S. PATENT DOCUMENTS

| | | | |
|---|---|---|---|
| 4,561,172 | 12/1985 | Slawinski et al. | 438/297 |
| 4,845,048 | 7/1989 | Tamaki et al. | 438/410 |
| 5,130,268 | 7/1992 | Liou et al. | 438/425 |
| 5,236,863 | 8/1993 | Iranmanesh | 438/429 |
| 5,431,772 | 7/1995 | Babie et al. | 438/714 |
| 5,433,794 | 7/1995 | Fazan et al. | 148/33.3 |
| 5,436,190 | 7/1995 | Yang et al. | 438/296 |
| 5,536,675 | 7/1996 | Bohr | 438/296 |
| 5,679,599 | 10/1997 | Mehta | 438/425 |

OTHER PUBLICATIONS

Stanley Wolf and Richard N. Tauber; *Silicon Processing for the VLSI Era, vol. 2—Process Integration*; pp. 45–58; 1990.

*Primary Examiner*—Benjamin L. Utech
*Assistant Examiner*—Binh X. Tran
*Attorney, Agent, or Firm*—Timothy M. Honeycutt

[57] ABSTRACT

An isolation structure and a method of making the same are provided. In one aspect, the method includes the steps of forming a trench in the substrate and a first insulating layer in the trench that has a bottom, a first sidewall and a second sidewall. Silicon nitride is deposited in the trench. Silicon nitride is removed from the bottom of the first insulating layer to establish a layer of silicon nitride on the first and second sidewalls by performing a first plasma etch of the deposited silicon nitride with an ambient containing He, $SF_6$, and HBr, and a second plasma etch with an ambient containing He, $SF_6$, and HBr. An insulating material is deposited in the trench. The method provides for reliable manufacture of nitride liners for trench isolation structures. Scaling is enhanced and the potential for parasitic leakage current due to liner oxide fracture or irregularity is reduced.

9 Claims, 3 Drawing Sheets

METHOD OF FABRICATION FOR ULTRA THIN NITRIDE LINER IN SILICON TRENCH ISOLATION

BACKGROUND OF THE INVENTION

1. Field of the Invention

This invention relates generally to semiconductor processing, and more particularly to an integrated circuit and to a method of making an isolation structure therefore incorporating a nitride liner.

2. Description of the Related Art

The implementation of integrated circuits involves connecting isolated circuit devices through specific electrical pathways. Where integrated circuits are implemented in silicon, it is necessary, therefore, to initially isolate the various circuit devices built into the silicon substrate form one another. The circuit devices are thereafter interconnected to create specific circuit configurations through the use of global interconnect or metallization layers and local interconnect layers.

Local oxidation of silicon ("LOCOS") an trench and refill isolation represent two heavily used violation techniques for both bipolar and metal oxide semiconductor ("MOS") circuits. In a conventional semi-recessed LOCOS process, a thin pad oxide layer is thermally grown on a silicon substrate surface and coated with a layer of chemical vapor deposition ("CVD") silicon nitride. The active regions of the substrate are then defend with a photolithographic step. The nitride layer is then dry etched and the pad oxide layer wet or dry etched with the photoresist left in place to serve as a masking layer for a subsequent channel stop implant. After the channel stop implant, field oxide regions are thermally grown by means of a wet oxidation step. The oxidation of the silicon proceeds both vertically into the substrate and laterally under the edges of the nitride layer, resulting in the formation of structures commonly known as bird's beaks.

The formation of bird's beak structures is problematic in a number of ways. To begin with, bird's beak formation can create significant limitations on the packing density of devices in an integrated circuit. Design rules for LOCOS processes must restrict the gaps between adjacent devices to account for the lateral encroachment of bird's beaks. In addition, the very shape of a bird's beak can result in the exposure of the substrate surface during subsequent overetching to open contacts for metallization. This can result in the source of the transistor becoming shorted to the well region when the metal interconnect film is deposited. This problem may be particularly acute in CMOS circuits where shallower junctions are used, due to the higher propensity for the exposure of the well regions. While some improvement in the formation of bird's beak structures has occurred as a result of the introduction of techniques such as the etchback of portions of the field oxide structures, deposition of a silicon nitride layer without a pad oxide layer, and use of a thin pad oxide covered with polysilicon, the difficulties associated with bird's beak formation have not been completely eliminated.

In trench based isolation structures, a damascene process is used to pattern and etch a plurality of trenches in the silicon substrate. The trenches are then refilled with a CVD silicon dioxide or doped glass layer that is planarized back to the substrate surface using etchback planarization of chemical mechanical polishing ("CMP"). In some conventional processes, a liner of thermally grown oxide is formed in the trenches prior to the CVD step. Although conventional trench and refill isolation techniques eliminate the difficulties associated with bird's beak formation in LOCOS processes, other difficulties may arise. Some of these difficulties include the inversion of the silicon at the sidewalls of p-type active regions which can lead to latch-up conditions in CMOS circuits, and the development of sidewall and edge-parasitic conduction stemming from a lack of planarity between the trench isolation material and the active areas.

The problem of sidewall inversion is caused by the establishment of a horizontal parasitic MOS device, with the well acting as the gate electrode and the trench dielectric acting as the MOS gate oxide. The voltage across this parasitic device will normally be the nominal operating voltage of the device, e.g., 3.3 or 5 volts. This gate voltage and the narrow trench width can cause inversion along the sidewall, outside of, but facing the well. At the onset of sidewall inversion, n-channel devices with source/drain regions abutted to the same sidewall can become electrically connected by a path along the sidewall.

Another other potential drawback of conventional trench and reflow isolation processing is the requirement for a very high degree of planarization of the trench dielectric and the substrate surface. To ensure that the CVD silicon dioxide trench isolation material is removed from all of the active areas at the conclusion of a typical etchback step, an overetch of the trench isolation material of at least 200 to 500 Å is performed. The trench isolation material is thus etched below the active area surface, exposing a portion of the active area sidewall. This exposed sidewall can lead to sidewall and edge parasitic conduction which can result in significant leakage currents and correspondingly poor device performance. CMP planarization can typically yield more highly planarized trench isolation dielectric and substrate surfaces. However, there remains the potential for small differentials in the upper surfaces of the substrate and the trench isolation dielectric at the interface between the two structures due primarily to differential polish rates during the CMP process.

In structures incorporating an oxide liner, leakage or shorting problems can still arise. Some of the potential problems stem for inadvertent fracturing of the upper corners of the oxide liner during CMP processing. Others are the result of process variations in the oxidation process to establish the liner oxide.

The present invention is directed to overcoming or reducing the effects of one or more of the foregoing disadvantages.

SUMMARY OF THE INVENTION

In accordance with one aspect of the present invention, a method of fabricating a liner on oxide film in an electrical isolation trench in a substrate where the oxide film has a bottom and first and second sidewalls is provided. The method includes the steps of depositing silicon nitride on the oxide film, and etching the silicon nitride away from the bottom of the oxide film selectively to oxide to leave a layer of silicon nitride on the first and second sidewalls.

In accordance with another aspect of the present invention, a method of fabricating an isolation structure on a substrate is provided that includes the steps of forming a trench in the substrate and a first insulating layer in the trench that has a bottom, a first sidewall and a second sidewall. A layer of silicon nitride is formed on the first and second sidewalls by depositing silicon nitride on the first insulating layer and etching the silicon nitride away from the bottom of the first insulating layer selectively to the first insulating layer to leave a first silicone nitride sidewall on the first sidewall and a second silicon nitride sidewall on the second sidewall. An insulating material is deposited in the trench.

In accordance with another aspect of the present invention, a method of fabricating an isolation structure on a substrate is provided that includes the steps of forming a trench in the substrate and a first insulating layer in the trench that has a bottom, a first sidewall and a second sidewall. Silicon nitride is deposited on the first insulating layer and then etched away from the bottom of the first insulating layer selectively to the first insulating layer to leave a first silicone nitride sidewall of the first sidewall and a second silicon nitride sidewall on the second sidewall by performing a first plasma etch of the deposited silicon nitride selectively to the underlying first insulating layer with an ambient containing He, $SF_6$, and HBr, and a second plasma etch selectively to the underlying first insulating layer with an ambient containing He, $SF_6$, and HBr. An insulating material is deposited in the trench.

In accordance with another aspect of the present invention, a method of fabricating an isolation structure on a substrate is provided that includes the steps of forming a trench in the substrate and a first insulating layer i the trench that has a bottom, a first sidewall and a second sidewall. Silicon nitride is deposited on the first insulating layer and then etched away from the bottom of the first insulating layer selectively to the first insulating layer to leave a first silicone nitride sidewall on the first sidewall and a second silicon nitride sidewall on the second sidewall by performing a first plasma etch of the deposited silicon nitride selectively to the underlying first insulating layer with an ambient containing about 64 to 80 volume % He, about 15 to 29 volume % $SF_6$, and about 4 to 9 volume % HBr, and at a a pressure of about 190 to 300 mtorr, and a second plasma etch selectively to the underlying first insulating layer with an ambient containing about 81 to 90 volume % He, about 7 to 15 volume % $SF_6$, and about 2 to 5 volume % HBr, and at a pressure of about 360 to 540 mtorr. An insulating material is deposited in the trench.

In accordance with another aspect of the present invention, an integrated circuit is provided that includes a substrate that has a plurality trenches segregating the substrate into a plurality of active areas. Each of the trenches has. A plurality of circuit devices are respectively positioned on the plurality of active areas. Isolation structures are positioned in the plurality of trenches. Each isolation structure has a first insulating layer with a first sidewall and a second sidewall, a silicon nitride layer positioned on the first and second sidewalls, and a layer of insulating material positioned between the layers of silicon nitride.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
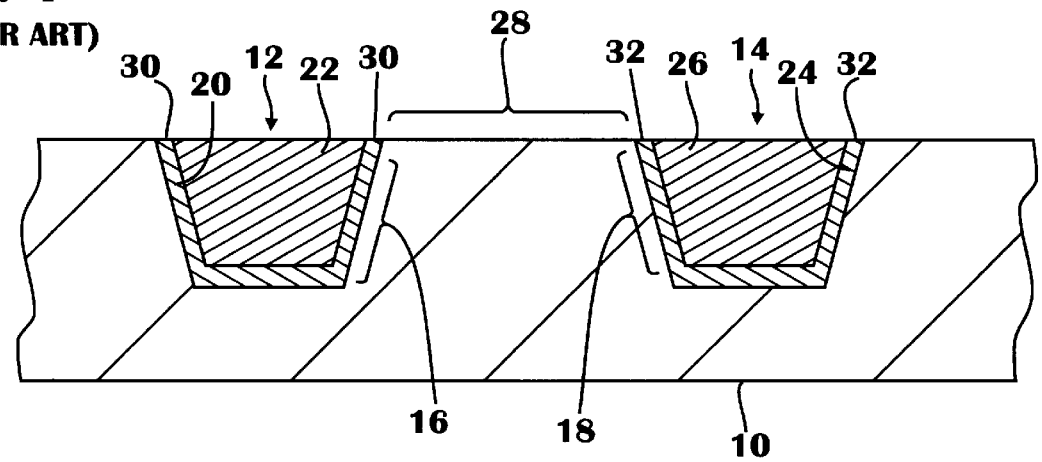
FIG. 1 is a cross-sectional view of an exemplary conventional trench isolation structure for a semiconductor substrate.

In the drawings described below, reference numerals are generally repeated where identical elements appear in more than one figure. FIG. 1 is a cross-sectional view of an exemplary semiconductor substrate 10 that is provided with conventional trench isolation structures 12 and 14 formed in respective trenches 16 and 18 in the substrate 10. The structure 12 consists of an oxide liner 20 that conformally coats the trench 16, and bulk insulating material 22 that is positioned on the oxide liner 20. The bulk insulating material 22 is typically composed of silicon dioxide or some type of doped glass. The structure 14 similarly consists of an oxide liner 24 and bulk insulating material 26. Although the structures 12 and 14 appear as separate components in cross-section, they are part of a moat-like structure that surrounds and physically isolates an active area 28 of the substrate 10.

The fabrication of the conventional isolation structures 12 and 14 entails etching the trenches 16 and 18, forming the oxide liners 20 and 24 by thermal oxidation of the substrate or CVD, and blanket deposition of a bulk layer of insulating material that will be subsequently processed to establish the bulk layers 22 and 26. The bulk layer of insulating material and the any portions of the oxide liners 20 and 24 that blanket the active area 28 are subsequently planarized to the substrate 10, usually by CMP. A relatively high degree of planarity is important to ensure that no insulating material remains on the upper surface of the active area 28 that would otherwise interfere with subsequent device operation and to ensure that the upper surface of the substrate 10 has an initial planarity so that subsequent interlevel dielectric and metallization layers will not exhibit exaggerated step height differences that might affect lithographic patterning resolution. As noted above, fracturing of the upper corners 30 of the oxide liner 20 and 32 of the oxide liner 24 can occur during CMP. These fractures can lead to shorting between overlying metallization or other conductor structures and source/drain regions established in the active area.

Figure 2:
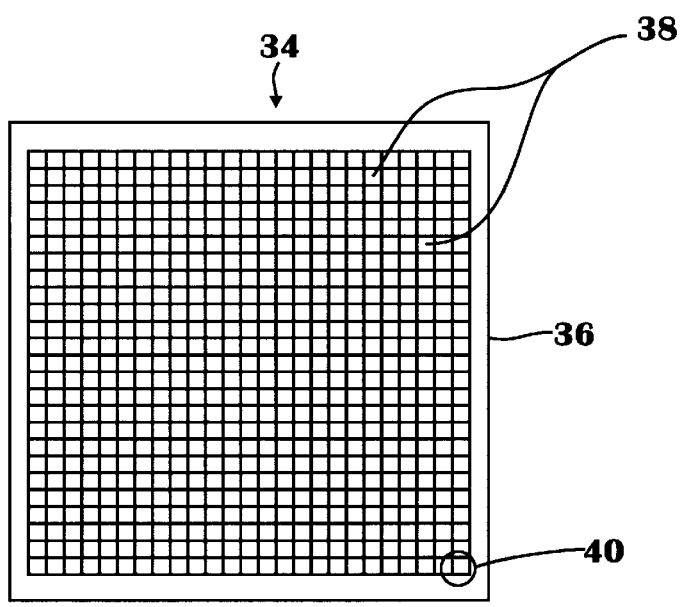
FIG. 2 is a plan view of an exemplary integrated circuit incorporating an isolation fabricated in accordance with the present invention.
Figure 3:
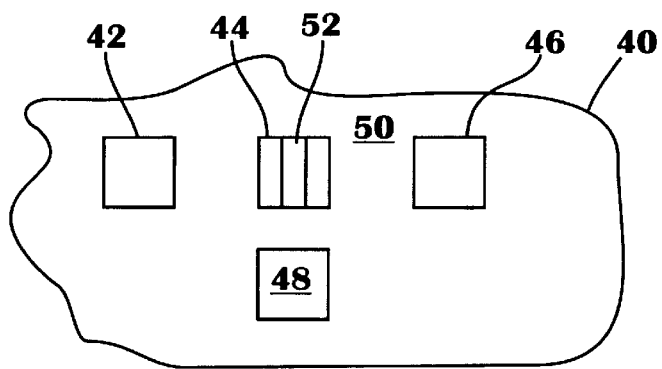
FIG. 3 is a plan view of a small portion of the integrated circuit of FIG. 2 in accordance with the present invention.

FIG. 2 is a plan view of an exemplary embodiment of an integrated circuit 34 in accordance with the present invention. The integrated circuit 34 includes a substrate 36 composed of a semiconductor material, such as, for example, n-doped or p-doped silicon, silicon-on insulator, or the like. A plurality of circuit devices, depicting schematically and designated 38, are implemented on the substrate 36. The circuit devices 38 may consist of a variety of different types of electronic circuit elements, such as, for example, transistors, capacitors, resistors, or the like. FIG. 3 is a highly magnified plan view of a very small portion of the integrated circuit 34 circumscribed by the circle 40 in FIG. 2. For simplicity of illustration, various metallization and interlevel dielectric layers that provide global and local interconnection for the circuit devices 38 are peeled away in FIG. 3 to reveal four exemplary underlying active areas 42, 44, 46 and 48 that are surrounded by a trench isolation structure 50. A field effect transistor 52 is implemented on the active area 44.

Figure 4:
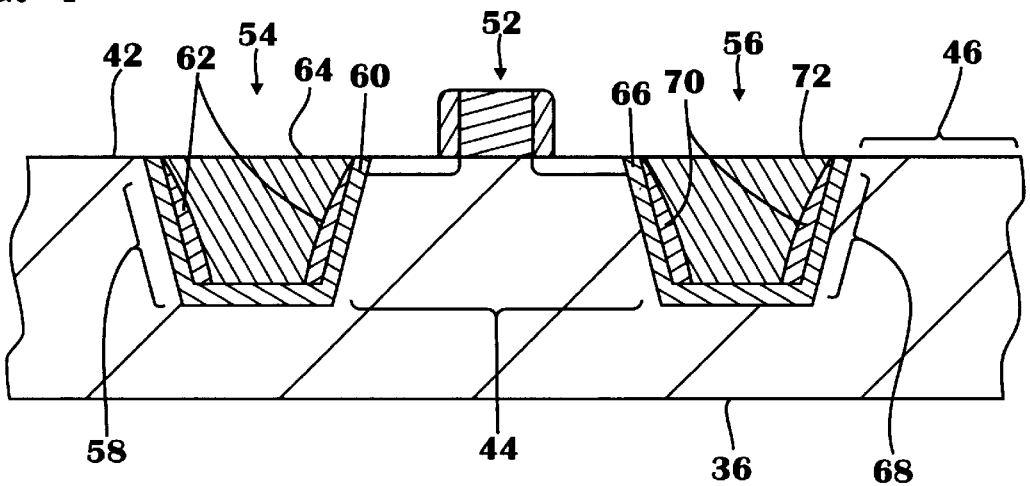
FIG. 4 is a cross sectional view of FIG. 3 taken at section 4—4 in accordance with the present invention.

The detailed structure of the isolation structure 50 may be understood by referring now to FIG. 4, which is a cross sectional view of FIG. 3 taken at section 4—4. The isolation structure 50 is depicted in FIG. 3 as a moat-like structure surrounding the active areas 42, 44, 46 and 48. In cross-section in FIG. 4, the structure 50 appears, and will be described as separate structures 54 and 56. The isolation structure 54 is positioned in a trench 58 formed in the substrate 36 and includes a first insulating or liner layer 60 that lines the bottom and sidewalls of the trench 58. The sidewalls of the liner 60 are, in turn, lined with a layer 62 of silicon nitride. A bulk insulating material 64 is positioned in the trench 58. The isolation structure 56 similarly consists of a liner 66 that lines the bottom and sidewalls of trench 68, a layer of silicon nitride 70 that lines the sidewalls of the liner 66 and a bulk of insulating material 72 positioned in the trench 68.

Figure 5:
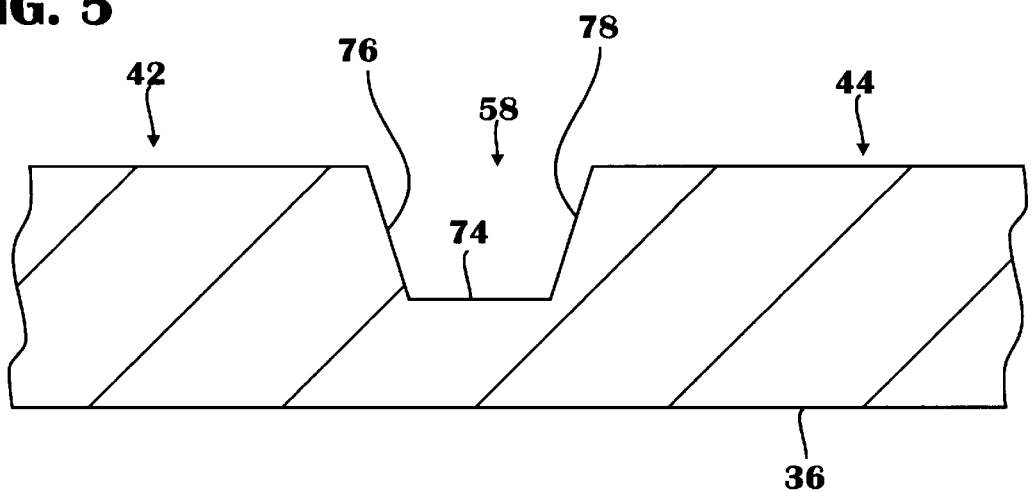
FIG. 5 is a cross sectional view like FIG. 4 depicting formation of an isolation trench in a semiconductor substrate in accordance with the present invention.

An exemplary process flow for fabricating the isolation structures 54 and 56 may be understood by referring now to FIGS. 5, 6, 7, 8 and 9 and initially to FIG. 5. For simplicity of illustration, the process flow will be described in the context of the isolation structure 54. However, the skilled artisan will appreciate that the discussion that follows is applicable to the structures 54 and 56 depicted in FIG. 4 as well as the overall isolation structure designated 50 and shown in plan view in FIG. 3. Initially, the trench 58 is formed in the substrate by appropriately masking the upper surface of the substrate and performing a directional etch to establish the trench 58 with a bottom 74 and inwardly sloping sidewalls 76 and 78. The sidewalls 76 and 78 are advantageously sloped with an angle of about 10 to 15° from vertical. The etch may be by reactive ion etching, chemical plasma etching or the like. Tapered sidewalls may be established by utilizing an etch chemistry that provides sidewall passivation during the etch, such as, for example, $HBr/Cl_2$. If desired, the sidewalls 76 and 78 may be defined with a vertical or nearly vertical orientation. The depth of the trench 58 is largely a matter of design discretion and will depend upon the particular design rules used by the designer. In an exemplary embodiment, the trench 58 may have a depth of about 2000 to 3000 Å. The lateral dimension of the trench 58 may be the minimum feature size possible using the currently available lithographic patterning technology, or some dimension smaller than or larger than the available minimum feature size.

Figure 6:
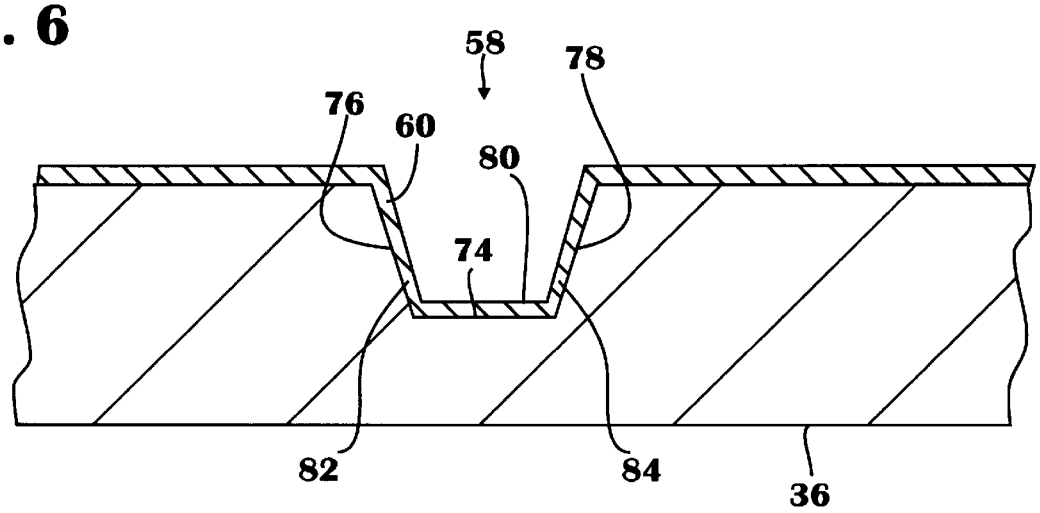
FIG. 6 is a cross sectional view like FIG. 5 depicting formation of an oxide liner layer in the trench in accordance with the present invention.

The fabrication of the liner layer 60 may be understood by referring now to FIG. 6. The liner layer 60 is designed to function as an etch stop to protect the underlying substrate 36 during subsequent processing of the silicon nitride liner layer 62 and the insulating material 64 shown in FIG. 4. The liner layer 60 is advantageously composed of a material that enables selective etching of silicon nitride and that may be readily removed from the upper surface of the substrate 36 during later processing by etching or CMP. Exemplary materials include silicon dioxide, tetra-ethyl-ortho-silicate ("TEOS"). Thermal oxidation of low pressure CVD ("LPCVD") may be used as appropriate. In an exemplary embodiment, the layer 60 is established by dry oxidation in an oxygen containing ambient at about 800 to 1050° C. for about 30 to 60 seconds in a rapid thermal anneal ("RTA") process. The geometry of the trench 58 establishes the liner layer 60 with a bottom portion 80 and opposing sidewalls 82 and 84. The thickness of the layer 60 may be about 20 to 100 Å.

Figure 7:
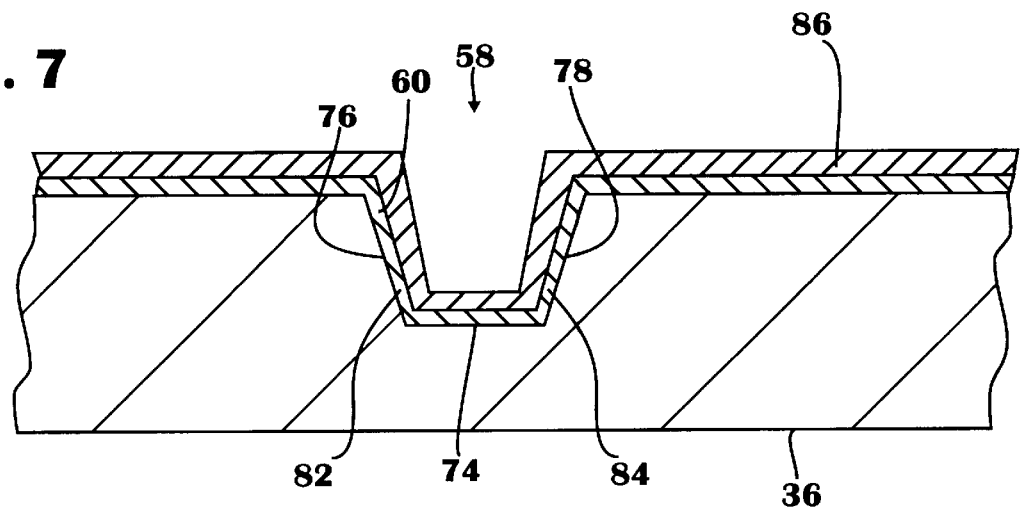
FIG. 7 is a cross sectional view like FIG. 6 depicting deposition of silicon nitride on the substrate in accordance with the present invention.
Figure 8:
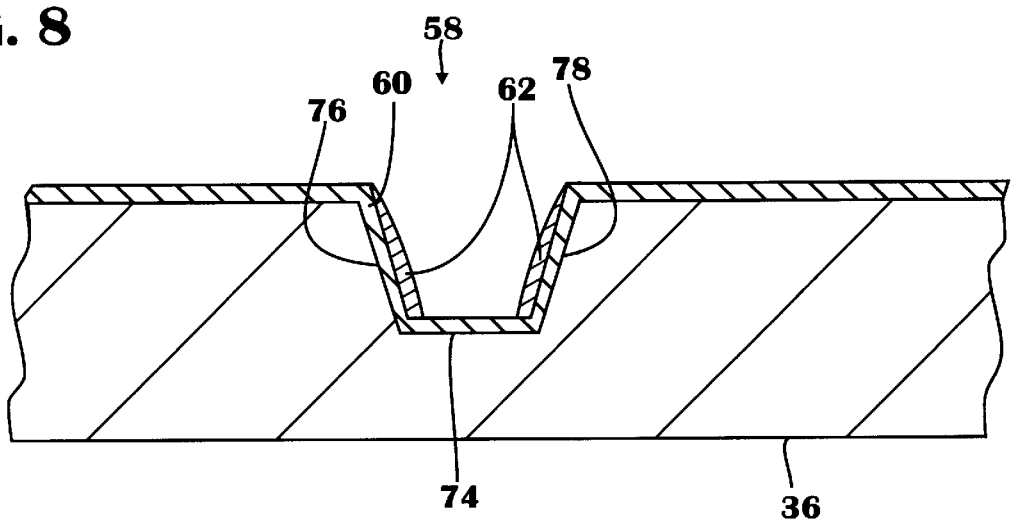
FIG. 8 is a cross sectional view like FIG. 7 depicting etch definition of a layer of silicon nitride on the oxide liner sidewalls in accordance with the present invention.

The fabrication of the silicon nitride liner 62 may be understood by referring now to FIGS. 7 and 8. Referring initially to FIG. 7, silicon nitride 86 is blanket deposited by plasma enhanced CVD, LPCVD, or the like, to a thickness of about 200 to 500 Å. As shown in FIG. 8, the silicon nitride 86 is anisotropically etched to define the silicon nitride layer 62 that lines the sidewalls 82 and 84 of the oxide liner 60. The etch removes the portions of the silicon nitride 86 overlying the upper surface of the substrate 36 as well as the portion of the oxide liner 60 overlying the bottom portion 80 of the layer 60. The etch to define the nitride layer 62 is advantageously performed in a plasma etch tool with a 13.56 megahertz frequency diode system, such as a LAM Rainbow 4400 series. A two step etch process is employed consisting of a first or main etch step followed by a second or overetch step. The main etch may be performed at a pressure of about 190 to 300 mtorr, a power setting of about 250 to 370 watts and a plate spacing of about 0.7 to 1.1 cm. The etch mixture consists of He, $SF_6$ and HBr. The proportions of He, $SF_6$ and HBr in the mixture, expressed in terms of volume percentages, may be about 64 to 80% He, about 15 to 29% $SF_6$ and about 4 to 9% HBr. In a more specific example, the main etch may be performed at about 240 mtorr, with a power setting of about 310 watts, a plates spacing of about 0.9 cm and an etchant mixture of about 250 cc of He, 72 cc of $SF_6$, and 20 cc of HBr. End point detection for the main etch may be by emission spectroscopy wherein a jump in the emissions in the vicinity of the trench bottom in the 405 nm wavelength range indicates a depletion of the silicon nitride at that area.

The illustrated etch chemistry provides a removal rate of about 3000 Å/minute with approximately a 2:1 nitride to oxide selectivity. Anisotropicity and uniformity control for the ultimate width of the silicon nitride liner 62 are largely a functions of the pressure and the volume percentage of $SF_6$. It is desirable to etch the silicon nitride with minimal risk of gouging the silicon substrate 36. In this regard, HBr added to the mixture provides enhanced selectivity to oxide.

The overetch may be performed at about 360 to 540 mtorr, with a power setting of about 240 to 360 watts and a plate spacing of about 0.7 to 1.1 cm. The etchant mixture may again be He, $SF_6$ and HBr. Proportions of the constituents of the etch mixture, as expressed as volume percentages, may be about 81 to 90% He, about 7 to 15% $SF_6$ and about 2 to 5% HBr. In a more specific example, the overetch may be performed at a pressure of about 450 mtorr, a power setting of about 300 watts, and a plate spacing of about 0.9 cm. The etch mixture may consist of about 250 cc of He, about 30 cc of $SF_6$ and about 10 cc of HBr. As with the main etch step, it is desirable to minimize silicon gouging during the overetch. Accordingly, the overetch is performed for a relatively short duration, for example, for about 1 to 5 seconds. In addition, the pressure during the overetch is increased and the percentage of $SF_6$ is reduced to enhance the selectivity to oxide.

Figure 9:
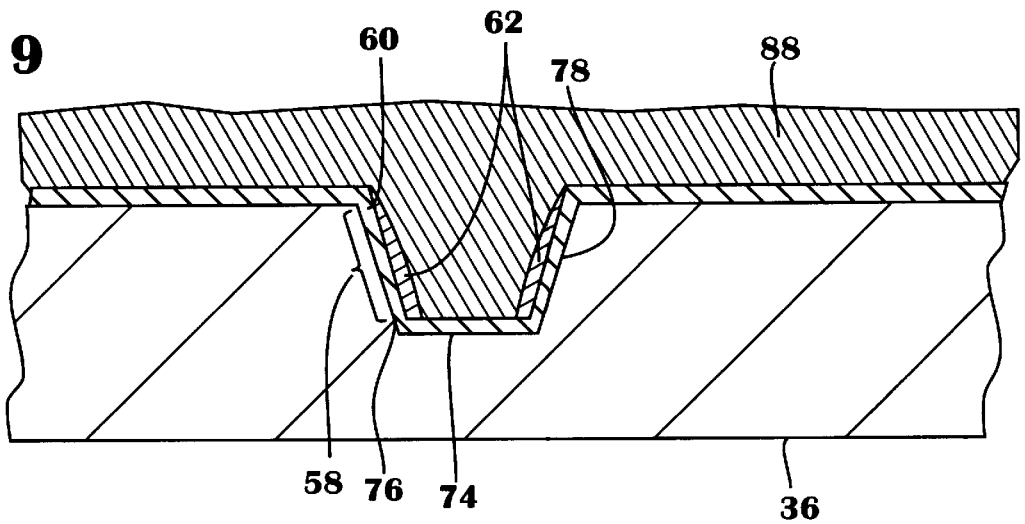
FIG. 9 is a cross sectional view like FIG. 8 depicting deposition of bulk insulating material on the substrate in accordance with the present invention.

Referring now to FIG. 9, bulk insulating material 88 is blanket deposited over the substrate 36, filling the trench 58. The insulating material 88 may be silicon dioxide, TEOS, spin-on-glass or the like, and may be deposited by well known CVD or spin-on techniques. Following deposition, the bulk material 88 is planarized to the substrate 36 by etchback planarization, CMP or the like, to yield the completed structure 54 as shown in FIG. 4. The transistor 52 shown in FIG. 4 may thereafter be fabricated using conventional techniques.

The process of the present invention yields an isolation structure with a nitride liner for enhanced electrical isolation. The etch process provides for consistent definition of a thin nitride liner 62 with low surface non-uniformity. Leakage due to inadvertent damage to the oxide-based liner 60 is reduced.

While the invention may be susceptible to various modifications and alternative forms, specific embodiments have been shown by way of example i the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of fabricating a liner on oxide film in an electrical isolation trench in a substrate, the oxide film having a bottom and first and second sidewalls, comprising the steps of:

depositing silicon nitride on the oxide film; and etching the silicon nitride away from the bottom of the oxide film selectively to oxide to leave a layer of silicon nitride on the first and second sidewalls by performing a first plasma etch of the deposited silicon nitride with an ambient containing about 64 to 80 volume % He, about 15 to 29 volume % $SF_6$, and about 4 to 9 volume % HBr, and at a pressure of about 190 to 300 mtorr, and a second plasma etch with an ambient containing about 81 to 90 volume % He, about 7 to 15 volume % $SF_6$, and about 2 to 5 volume % HBr, and at a pressure of about 360 to 540 mtorr.

2. The method of claim 1, wherein the second plasma etch step is performed for about 1 to 5 seconds.

3. The method of claim 1, wherein formation of the trench comprises anisotropically etching the substrate to establish first and second trench sidewalls with an inward slope.

4. The method of claim 1, wherein the second plasma etch step is performed for about 1 to 5 seconds.

5. The method of claim 1, wherein formation of the oxide film comprises oxidizing exposed surfaces of the trench prior to depositing the layer of silicon nitride.

6. A method of fabricating an isolation structure on a substrate, comprising the steps of:

forming a trench in the substrate;

forming a first insulating layer in the trench, the first insulating layer having a bottom, a first sidewall and a second sidewall;

depositing silicon nitride on the first insulating layer and etching the silicon nitride away form the bottom of the first insulating layer selectively to the first insulating layer to leave a first silicone nitride sidewall on the first sidewall and a second silicon nitride sidewall on the second sidewall by performing a first plasma etch of the deposited silicon nitride selectively to the underlying first insulating layer with an ambient containing about 64 to 80 volume % He, about 15 to 29 volume % $SF_6$, and about 4 to 9 volume % HBr, and at a pressure of about 190 to 300 mtorr, and a second plasma etch selectively to the underlying first insulating layer with an ambient containing about 81 to 90 volume % He, about 7 to 15 volume % $SF_6$, and about 2 to 5 volume % HBr, and at a pressure of about 360 to 540 mtorr; and depositing an insulating material in the trench.

7. The method of claim 6, wherein the step of forming the trench comprises anisotropically etching the substrate to establish first and second trench sidewalls with an inward slope.

8. The method of claim 6, wherein the second plasma etch step is performed for about 1 to 5 seconds.

9. The method of claim 6, wherein the step of forming the first insulating layer comprises oxidizing exposed surfaces of the trench prior to forming the layer of silicon nitride.

* * * * *

UNITED STATES PATENT AND TRADEMARK OFFICE
CERTIFICATE OF CORRECTION

Page 1 of 2

PATENT NO. : 6,114,251

DATED : September 5, 2000

INVENTOR(S) : Thien T. Nguyen et al.

It is certified that error appears in the above-identified patent and that said Letters Patent is hereby corrected as shown below:

In column 1, line 17, delete "form" and substitute --from-- therefor;

In column 1, line 22, delete "an" and substitute --and-- therefor;

In column 1, line 28, delete "nitrode" and substitute --nitride-- therefor;

In column 2, line 19, delete "other";

In column 2, line 41, delete "for" and substitute --from-- therefor;

In column 2, line 51, insert the word --an-- between the words "on" and "oxide";

In column 2, line 67, delete "silicone" and substitute --silicon-- therefor;

In column 3, line 12, delete "silicone" and substitute --silicon-- therefor;

In column 3, line 22, delete "i" and substitute --in-- therefor;

In column 3, line 42, delete "Each of the trenches has.";

In column 7, line 7, delete "i" and substitute --in-- therefor;

In claim 1, first line, insert the word --an-- after the word "on"; and

In claim 6, tenth line, delete "silicone" and substitute --silicon-- therefor.

UNITED STATES PATENT AND TRADEMARK OFFICE
CERTIFICATE OF CORRECTION

PATENT NO. : 6,114,251
DATED : September 5, 2000
INVENTOR(S) : Thien T. Nguyen et al.

It is certified that error appears in the above-identified patent and that said Letters Patent is hereby corrected as shown below:

In claim 1, first line, insert the word --an-- after the word "on"; and

In claim 6, tenth line, delete "silicone" and substitute --silicon-- therefor.

Signed and Sealed this

Twenty-ninth Day of May, 2001

Attest:

NICHOLAS P. GODICI

Attesting Officer

Acting Director of the United States Patent and Trademark Office